(12) United States Patent
Van Bommel et al.

(10) Patent No.: US 9,772,071 B2
(45) Date of Patent: Sep. 26, 2017

(54) LIGHT EMITTING ASSEMBLY, A LAMP AND A LUMINAIRE

(71) Applicant: KONINKLIJKE PHILIPS N.V., Eindhoven (NL)

(72) Inventors: Ties Van Bommel, Horst (NL); Rifat Ata Mustafa Hikmet, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 46 days.

(21) Appl. No.: 14/423,509

(22) PCT Filed: Aug. 23, 2013

(86) PCT No.: PCT/IB2013/056846
§ 371 (c)(1),
(2) Date: Feb. 24, 2015

(87) PCT Pub. No.: WO2014/030148
PCT Pub. Date: Feb. 27, 2014

(65) Prior Publication Data
US 2015/0300577 A1 Oct. 22, 2015

Related U.S. Application Data

(60) Provisional application No. 61/692,722, filed on Aug. 24, 2012.

(51) Int. Cl.
*F21V 9/16* (2006.01)
*F21K 99/00* (2016.01)
(Continued)

(52) U.S. Cl.
CPC .................. *F21K 9/56* (2013.01); *F21K 9/64* (2016.08); *F21V 9/06* (2013.01); *F21V 9/08* (2013.01);
(Continued)

(58) Field of Classification Search
CPC ..... F21K 9/50; F21K 9/54; F21K 9/56; F21V 9/06; F21V 9/08; H01L 25/0753; H01L 33/502; H01L 33/504
See application file for complete search history.

(56) References Cited

U.S. PATENT DOCUMENTS 7,791,092 B2    9/2010  Tarsa et al.
8,071,988 B2 *  12/2011 Lee ..................... H01L 25/0753
                                                           257/88
(Continued)

FOREIGN PATENT DOCUMENTS

CN    101765923 A      6/2010
DE    102005020695 A1  12/2005
(Continued)

*Primary Examiner* — Alexander Garlen

(57) ABSTRACT

A light emitting assembly 100, a lamp and a luminaire are provided. The light emitting assembly 100 comprises a first light source 112, a second light source 118, a first luminescent material 106, a second luminescent material 116 and a light exit window 102. The first light source 112 emits light 110 in a Ultra Violet spectral range. The second light source 118 emits light in a blue spectral range having a first peak wavelength. The first luminescent material 106 is arranged to receive light 110 from the first light source 112 and is configured to absorb light 110 in the Ultra Violet spectral range and to convert a portion of the absorbed light towards light 104 in the blue spectral range. The second luminescent material 116 is arranged to receive light 105 from the second light source 118 and is configured to almost fully convert the received light 105 in the blue spectral range received from the second light source to light with a spectral range of light having a second peak wavelength. The second peak wavelength is larger than the first peak wavelength. The light exit window 102 is arranged to transfer light emitted by the first (Continued)

luminescent material 106 and by the second luminescent material 116 into an ambient of the light emitting assembly 100.

15 Claims, 5 Drawing Sheets

(51) Int. Cl.

| | | |
|---|---|---|
| *H01L 25/075* | (2006.01) | |
| *H01L 33/50* | (2010.01) | |
| *F21V 9/06* | (2006.01) | |
| *F21V 9/08* | (2006.01) | |
| *F21V 15/01* | (2006.01) | |
| *F21K 9/64* | (2016.01) | |
| *F21K 9/232* | (2016.01) | |
| *F21K 9/27* | (2016.01) | |
| *F21Y 115/10* | (2016.01) | |
| *F21Y 113/13* | (2016.01) | |

(52) U.S. Cl.
CPC .......... *F21V 15/01* (2013.01); *H01L 25/0753* (2013.01); *H01L 33/504* (2013.01); *F21K 9/232* (2016.08); *F21K 9/27* (2016.08); *F21Y 2113/13* (2016.08); *F21Y 2115/10* (2016.08); *H01L 33/507* (2013.01); *H01L 2924/0002* (2013.01)

(56) References Cited

U.S. PATENT DOCUMENTS

| | | | |
|---|---|---|---|
| 8,118,441 | B2 | 2/2012 | Hessling |
| 2003/0092345 | A1 | 5/2003 | Wang et al. |
| 2006/0068154 | A1* | 3/2006 | Parce ..................... B82Y 20/00 428/76 |
| 2006/0138435 | A1 | 6/2006 | Tarsa et al. |
| 2008/0316741 | A1* | 12/2008 | Lee ...................... G02B 6/0068 362/231 |
| 2010/0025700 | A1 | 2/2010 | Jung et al. |
| 2010/0207134 | A1 | 8/2010 | Yanaka et al. |
| 2011/0215349 | A1* | 9/2011 | An ......................... H01L 33/08 257/89 |
| 2012/0001204 | A1 | 1/2012 | Jagt |
| 2012/0008647 | A1 | 1/2012 | Matsuda et al. |
| 2012/0132936 | A1 | 5/2012 | Yeh et al. |

FOREIGN PATENT DOCUMENTS

| | | |
|---|---|---|
| EP | 2172984 A1 | 4/2010 |
| JP | 2007122950 A | 5/2007 |
| JP | 2010129993 A | 6/2010 |
| JP | 2011066227 A | 3/2011 |
| JP | 2011199054 A | 10/2011 |
| JP | 2012074276 A | 4/2012 |
| JP | 2012084276 A | 4/2012 |
| WO | 2008026851 A1 | 3/2008 |
| WO | 2009104136 A1 | 8/2009 |
| WO | 2012033180 A1 | 3/2012 |

* cited by examiner

US 9,772,071 B2

LIGHT EMITTING ASSEMBLY, A LAMP AND A LUMINAIRE

CROSS-REFERENCE TO PRIOR APPLICATIONS

This application is the U.S. National Phase application under 35 U.S.C. §371 of International Application No. PCT/IB13/056846, filed on Aug. 23, 2013, which claims the benefit of U.S. Provisional Patent Application No. 61/692,722, filed on Aug. 24, 2012. These applications are hereby incorporated by reference herein.

FIELD OF THE INVENTION

The invention relates to color conversion assemblies for converting light emitted by light sources towards light of a different color.

BACKGROUND OF THE INVENTION

In several applications a Light Emitting Diode (LED), which emits blue light, is combined with luminescent material which converts a part of the blue light towards light of another color, for example, to yellow, orange or red light. Often, blue light is partially converted to the another color, because white light must be emitted by an assembly of the LED and the luminescent material. The amount and characteristics of the luminescent material is chosen such that a required amount of blue light is converted towards a specific amount the another color such that the combined emission of remaining blue light and the specific amount of the light of the another color combines to white light, which means, to a light with a color point which is close to the black body line in a color space.

For example, published patent application US2012/0001204 discloses a color adjusting arrangement wherein light emitters are combined with layers of luminescent materials to obtain a light emission of a specific color.

However, during production of lighting assemblies that use a combination of a blue light source and a layer of luminescent material which partially converts the blue light to light of another color a problem arises. It is relatively difficult to manufacture light emitters, for example LEDs, which all emit exactly the same blue light emission spectrum. It is not acceptable to combine light emitters, which slightly deviate from each other, with only one type of a layer with one specific amount of luminescent material, because it would result in lighting assemblies that emit slightly different colors of light. The emission of slightly different colors of light is well detectable by the human naked eye and may lead, for example, to luminaires with different light sources each emitting slightly different colors of light. A known solution is: each blue light emitter is characterized and binned, after manufacturing the blue light emitting light emitters, and each blue light emitter is combined with a layer with luminescent material of a certain thickness related to the characteristics of the specific blue light emitter to obtain a light emission that has the desired color point. Characterizing and binning the manufactured light emitters is relatively expensive, and a relatively large amount of different layers with luminescent material need to be kept in stock which is also relatively expensive.

SUMMARY OF THE INVENTION

It is an object of the invention to provide a light emitting assembly which emits light of a well-defined color point independent of small deviations in the color emitted by the used light sources.

A first aspect of the invention provides a light emitting assembly. A second aspect of the invention provides a lamp. A third aspect of the invention provides a luminaire. Advantageous embodiments are defined in the dependent claims.

A light emitting assembly in accordance with the first aspect of the invention comprises a first light source, a second light source, a first luminescent material, a second luminescent material and a light exit window. The first light source emits light in a Ultra Violet spectral range. The second light source emits light in a blue spectral range having a first peak wavelength. The first luminescent material is arranged to receive light from the first light source and is configured to absorb light in the Ultra Violet spectral range and to convert a portion of the absorbed light towards light in the blue spectral range. The second luminescent material is arranged to receive light from the second light source and is configured to almost fully convert the received light in the blue spectral range received from the second light source to light of a spectral range of light having a second peak wavelength. The second peak wavelength is larger than the first peak wavelength. The light exit window is arranged to transfer light emitted by the first luminescent material and by the second luminescent material into an ambient of the light emitting assembly.

The light emitting assembly comprises two light sources which each emit light in a specific spectral range. The exact position of the light emission of these light source within the specific spectral ranges may slightly deviate because the visible light, which is emitted via the light exit window into the ambient, is generated by luminescent material and does not directly originate from the second light source. In general, the light emitted by the luminescent material has a well-defined color (which means: a well-defined light emission spectrum) independent of slight deviations of the spectrum of the light which is absorbed by the luminescent material. Thus, when light sources are used of which the exact position of their emission spectrum is not known, the luminescent materials convert these inexactly known position of the spectra towards light emission spectra which are exactly known. Therefore, the color point of the emitted light is well known while at the same time not-binned (and, thus, relatively cheap) light sources are used.

The light of the second light source is almost fully converted towards light of a higher wavelength. This means that the first luminescent material absorbs almost all light emitted by the second light source (and converts it to light of a higher wavelength) and that the light emitting assembly does not emit light which directly originates from the second light source. However, in practical embodiments it may be impossible to absorb all light, for example, because of reflections. In the context of the invention it is assumed that, if some light of the second light source is still emitted via the light exit window into the ambient, this is not visible to the human naked eye. It may imply that at least 90% of the light emitted by the second light source is absorbed by the second luminescent material. Optionally, it may imply that at least 95% of the light emitted by the second light source is absorbed by the second luminescent material. Further, it is to be noted that the term "fully convert" may not be interpreted as "all absorbed light is converted towards light of a higher wavelength", because each luminescent material has a limited inefficiency because of the Stokes shift. Thus, the second luminescent converts some energy of the absorbed light towards heat.

It is to be noted that the light emitted by the first light source (which emits light in the Ultra Violet spectral range) is, in an optional embodiment, not fully converted and, thus, some light originating from the first light source may be emitted into the ambient. However, light in the Ultra Violet (UV) spectral range is not visible for the human naked eye and does not influence the perception of color. Thus, the emitted UV light does not change the color point of the visible light emitted by the light emitting assembly.

The specific configuration of the light emitting assembly is also relatively efficient. By using two different light sources which each emit in a different spectral range, the Stokes shifts between the absorbed light and the emitted light are limited. The Stokes shift is the difference between the maximum wavelength of spectrum the absorbed light and the maximum wavelength of the spectrum of the emitted light. Each luminescent material has a limited inefficiency which increases if the Stokes shift increases. Ultra Violet light is only converted to blue, which is a relatively small stokes shift. This generated blue light is not used for being converted by the second luminescent material to light of a higher wavelength, because it would introduce two consecutive color conversion steps, and, thus two times a loss of energy. Instead, a blue light source is used of which the light is almost fully converted to light of a higher wavelength, and, thus, the energy loss of two consecutive color conversion steps is reduced. Furthermore, today several high power blue emitting light sources are available on the market for relatively low prices and, thus, the manufacturing price of the light emitting assembly is kept within acceptable limits.

Within the context of the invention, the UV spectral range comprises wavelengths between 10 nanometer and 400 nanometer. In practical embodiments of the invention, the light emitted by the first light source comprises wavelengths between 300 nanometer and 400 nanometer. Within the context of the invention, the blue spectral range comprises wavelengths between 440 nanometer and 500 nanometer.

Optionally, the second luminescent material is configured to fully convert the received light in the blue spectral range to light with the second peak wavelength.

Optionally, the light of the spectral range with the second peak wavelength comprises light in at least one of the red, orange or yellow spectral range. If the light emitted by the second wavelength is converted towards light in the yellow spectral range, white light of a relatively high Correlated Color Temperature (CCT) may be emitted through the light exit window. The stokes shift between blue light and yellow light is relatively small and, thus, is the efficiency of the conversion from blue to yellow light relatively efficient. If the light is converted towards orange light and/or to red light, the white light may be created with a lower CCT. When the yellow orange red portion of the visible spectrum is roughly subdivided into individual colors, yellow light has a wavelength in the range from 570-590 nanometer, orange light has a wavelength in the range from 590 to 620 nanometer, and red light has a wavelength in the range from 620 to 750 nanometer.

Optionally, the first luminescent material is in contact with the first light source and/or the second luminescent material is in contact with the second light source. If the luminescent material is directly applied on the light source, the luminescent material received the light which it has to receive and the probability of leakage of light from the first light source towards the second luminescent material or leakage of light from the second light source towards the first luminescent material is reduced.

Optionally, a gap is present between the first light source and the first luminescent material and/or a gap is present between the second light source and the second luminescent material. In this configuration the gap may be relatively small, for example, 500 micrometer, which means that the luminescent material is arranged in a so-termed near-configuration. The gap may also be larger, for example, a few millimeters, which is often termed the "vicinity-configuration", or, for example, one or more centimeters, which is often termed the "remote-configuration". When a gap is present between the light sources and their associated luminescent material, the transfer of heat from the light sources to the luminescent material is reduced and thereby deterioration or accelerated aging of the luminescent material is prevented. Further, the light (energy) density of the received light per unit area is reduced which may be advantageous because, for example, the amount of heat generated in a unit volume of luminescent material is reduced. It is to be noted that the gap needs to be light transmitting, which means that the absorption of light within the gap is limited. Thus, the gap may comprise a gas, or environmental air or, or may be filled with a transparent material such as Silicone.

Optionally, the first light source, the first luminescent material, the second light source and the second luminescent material are arranged to prevent cross-illumination between the first light source and the second luminescent material and between the second light source and the first luminescent material. Cross-illumination means in the context of the invention that it is prevented that the first light source illuminates the second luminescent material, that it is prevented that the second light source illuminates the first luminescent material, that it is prevented that the light emitted by the first luminescent material illuminates the second luminescent material and that it is prevent that the light emitted by the second luminescent material illuminates the first luminescent material. If the luminescent materials receive light from a light source from which it shall not receive light and if the luminescent material converts this light, inefficiencies are introduced: a large stokes shift from UV light to yelloworangeyellow light results in a lot of energy losses and blue light may be converted to blue light while absorbing some of the energy of the received blue light. If the luminescent materials receive light that is emitted by the other luminescent materials and if this light is absorbed, inefficiencies are introduced: a part of the light emitted through the light exit window is subject to two color conversion steps by different luminescent materials, and, thus, was subject to two times a conversion inefficiency.

Optionally, the first luminescent material and the second luminescent material are arranged in a spatial separated configuration. If the respective luminescent materials are spatially separated it is easier to prevent cross-illumination.

Optionally, the first luminescent material is configured to fully convert the light of the Ultra Violet spectral range towards light of the blue spectral range. When all light emitted by the first light source is converted towards light of the blue spectral range, there are no losses with respect to UV light which is not usefully used. In an earlier embodiment, the interpretation of the term "fully convert" is discussed. The earlier provided interpretation also applies to this optional embodiment.

Optionally, the light emitting assembly comprises more than one first light source and/or the light emitting assembly comprises more than one second light source.

Optionally, at least one of the first light source and the second light source is a solid state light emitter. Examples of solid state light emitters are Light Emitting Diodes (LEDs), Organic Light Emitting diode(s) OLEDs, or, for example, laser diodes. Solid state light emitters are relatively cost effect light sources because they are, in general, not expensive, have a relatively large efficiency and a long life-time.

Optionally, at least one of the first luminescent material and the second luminescent material comprises an inorganic phosphor, an organic phosphor, quantum dots, quantum rods or quantum tetrapods. These types of luminescent materials are useful in the context of the invention, because their light emission spectrum does substantially not change when light of slightly varying spectra are absorbed. All types of luminescent materials comprise a specific luminescent material which provides the required color conversion of the invention.

Optionally, the light emitting assembly comprises a Ultra Violet filter configured to prevent the emission of light in the Ultra Violet spectral range into the ambient. In general it is not desired to emit Ultra Violet into the ambient. This light is not seen by the human naked eye and may have a not desired influence on persons and/or materials present in the environment of the light emitting assembly. Therefore, if not all light emitted by the first light source is converted to blue light, the Ultra Violet filter may be provided in the light emitting assembly. The Ultra Violet filter may be arranged a the light exit window, and may be arranged at another position within the light emitting assembly as long as the emission of UV light into the ambient is prevented.

Optionally, the light emitting assembly comprises a blue light absorption filter which is arranged between the second luminescent material and the ambient to prevent leakage of light in a blue spectral range. Thus, when still some blue light, which is emitted by the second light source, leaks through an element with the second luminescent material, the blue light absorption filter prevents that this light is emitted into the ambient, and thus, variations in the light emission of the second light source cannot be seen by persons looking towards the light emitting assembly. It is to be noted that the blue light absorption filter is not arranged in between the first luminescent material and the ambient.

According to the second aspect of the invention, a lamp is provided which comprises a light emitting assembly according to the first aspect of the invention. The lamp according to the second aspect of the invention may be a retro-fit light bulb or light tube. In other embodiments, the lamp has another shape, for example, the shape of a box.

According to the third aspect of the invention, a luminaire is provided which comprises a light emitting assembly according to the first aspect of the invention or which comprises a lamp according to the second aspect of the invention.

The lamp according to the second aspect of the invention and the luminaire according to the third aspect of the invention provide the same benefits as the light emitting assembly according to the first aspect of the invention and have similar embodiments with similar effects as the corresponding embodiments of the system.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the light emitting assembly, the lamp and the luminaire, which correspond to the described modifications and variations of the light emitting assembly, can be carried out by a person skilled in the art on the basis of the present description.

Figure 1A:
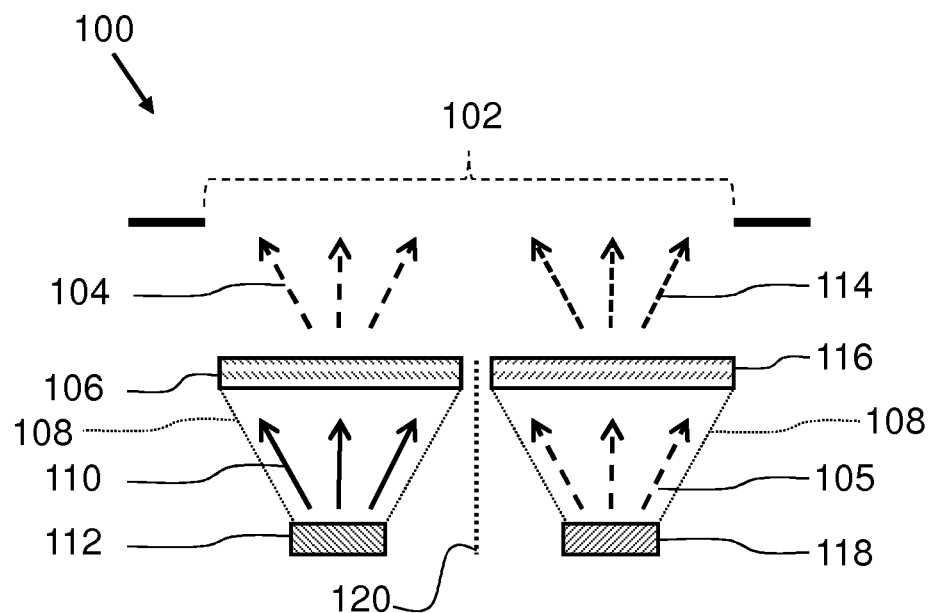
FIG. 1a schematically shows a cross-sectional view of a first embodiment of a light emitting assembly in accordance to the first aspect of the invention, FIG. 1b schematically shows the conversion of spectra of light, FIG. 2a schematically shows a cross-sectional view of a second embodiment of a light emitting assembly, FIG. 2b schematically shows a cross-sectional view of a third embodiment of a light emitting assembly, FIG. 3a schematically shows a cross-sectional view of a fourth embodiment of a light emitting assembly, FIG. 3b schematically shows a cross-sectional view of a fifth embodiment of a light emitting assembly, FIG. 4a schematically shows a first embodiment of a lamp in accordance with the second aspect of the invention, FIG. 4b schematically shows a second embodiment of a lamp, FIG. 4c schematically shows a third embodiment of a lamp, and FIG. 5 schematically shows a luminaire according to the third aspect of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

FIG. 1a schematically shows a cross-sectional view of a first embodiment of a light emitting assembly 100 in accordance to the first aspect of the invention. The light emitting assembly 100 comprises a first light source 112 which emits light 110 in an Ultra Violet spectral range, which means that at least the peak wavelength of the light emission of the first light source 112 falls within the range from 10 nanometer to 400 nanometer. The light emitting assembly 100 further comprises a second light source 118 which emits light 105 in a blue spectral range. Thus, the light 105 emitted by the second light source 118 has a first peak wavelength which falls within the range from 440 nanometer to 500 nanometer. The light emitting assembly further comprises a first luminescent material 106, a second luminescent material 116 and a light exit window 102.

In the embodiment of FIG. 1a, the first luminescent material 106 is arranged in a layer of, for example, a matrix polymer. However, in other embodiments, the luminescent material may also be provided as a coating on a transparent layer. In the context of the invention, the first luminescent material 106 is arranged to receive light 110 from the first light source 112. The first luminescent material 106 is configured to absorb light 110 in the Ultra Violet spectral range and to convert at least a portion of the absorbed light toward light 104 in the blue spectral range. It is to be noted that the light 104 emitted by the first luminescent material 106 is blue and that the light 105 emitted by the second light source 118 is also blue, however, their exact light emission spectra may be different. Especially the light emission of the second light source 118 is subject to manufacturing deviations. The light emission spectrum of the blue light 104 emitted by the first luminescent material 106 is relatively stable and does not deviate between different batches of the first luminescent material 106. It is further to be noted that the first luminescent material 106 may convert some of the absorbed light towards heat because of the Stokes shift of the first luminescent material 106. Further, in an optional embodiment, all Ultra Violet light 110 is absorbed, however, in the context of the invention it is not necessary to convert all Ultra Violet light 110 which is emitted by the first light source 112.

In the embodiment of FIG. 1a, the second luminescent material 116 is arranged in a layer, for example, in a layer of a matrix polymer. However, in the context of the invention it is only important that the second luminescent material 116 is arranged to receive light 104 from the second light source 118. The second luminescent material 116 is configured to absorb almost all the light 105 received from the second light source 118 and to convert the absorbed light towards light 114 of a spectral range that has a second peak wavelength. The second peak wavelength is larger than the first peak wavelength. Thus, the light 114 of the spectral range with the second peak wavelength comprises at least a substantially amount of light in the green, yellow, orange, and/or red spectral range. Almost fully convert means in the context of the invention that nothing of the received light remains in the light emission of the light emitting assembly 100. In a practical embodiment it means that the second luminescent material 116 absorbs all light 105. It is to be noted that it does not necessarily means that the conversion of blue light into light with a higher wavelength is 100% energy efficient. Some of the energy of the absorbed blue light is converted into heat by the second luminescent material 116 because of the Stoke shift of the luminescent material. It is to be noted that a thickness of a layer with the second luminescent material 116 should be large enough to prevent the leakage of blue light through the layer with the second luminescent material 116. In an embodiment, the second luminescent material 116 is configured to absorb all the light 105 received from the second light source 118 and to fully convert the absorbed light towards light 114 of a spectral range that has a second peak wavelength. If the layer which comprises the second luminescent material 116 is not thick enough to convert all the light 105 received from the second light source 118, a layer may be provided on top of the layer with the second material 116, which absorbs or back-reflects light which still leaks through the layer with the second luminescent material 116.

The light exit window 102 is schematically indicated in FIG. 1a as an opening between two dark lines. The light 104, 114 which is generated by the first luminescent material 106 and which is generated by the second luminescent material 116 is emitted into the ambient of the light emitting assembly 100 through the light exit window 102. It means that the relative arrangement of the light exit window 102 with respect to the first luminescent material 106 and the second luminescent material 116 is such that the generated blue light 104 and the generated light 114 in the spectral range with the second peak wavelength is emitted towards the light exit window 102 and leaves the light emitting assembly 100 through the light exit window 102. In a practical embodiment, the light exit window 102 may be an opening in a substantially opaque housing around the light emitting assembly 100, or the light exit window 102 is formed by neighboring luminescent elements which each comprise one of the first luminescent material 106 and the second luminescent material 116.

In an embodiment, if the first luminescent material 106 does not convert all UV light 110 towards blue light 104, the light emitting device 100 may be provided with an UV filter for preventing the emission of UV light 110 into the ambient. The UV filter is, for example, provided at the light exit window 102.

In a further embodiment, as drawn in FIG. 1a, the first light source 112 emits the UV light 110 in a well-defined light beam 108 to the first luminescent material 106, thereby preventing that UV light 110 is emitted onto the second luminescent material 116. In the same embodiment, the second light source 118 emits the blue light 105 in a well-defined light beam 108 to the second luminescent material 116 thereby preventing that light 105 emitted by the second light source 118 is received by the first luminescent material 106. In other embodiments, the light emitting assembly 100 comprises one or more separation walls 120 for preventing cross-illumination, meaning, preventing that light 110 from the first light source 112 is received by the second luminescent material 116 and preventing that light 105 from the second light source 118 is received by the first luminescent material 106.

The first light source 112 and/or the second light source 118 are a solid state light emitter. Examples of solid state light emitters are Light Emitting Diodes (LEDs), Organic Light Emitting diode(s) OLEDs, or, for example, laser diodes. A Light Emitting diode (LED) may be a GaN or InGaN based LED for emitting blue light in, for example, the wavelength range from 440 to 460 nanometer.

The luminescent material may be an inorganic luminescent material, an organic luminescent material, or, for example, a material which comprises particles showing quantum confinement and have at least in one dimension a size in the nanometer range.

Examples of inorganic luminescent material, e.g. phosphors, suitable for use in the invention include, but are not limited to, cerium doped yttrium aluminum garnet ($Y_3Al_5O_{12}$:$Ce^{3+}$, also referred to as YAG:Ce or Ce doped YAG) or lutetium aluminum garnet (LuAG, $Lu_3Al_5O_{12}$), α-SiAlON:$Eu^2$ (yellow), and $M_2Si_5N_8$:$Eu^{2+}$ (red) wherein M is at least one element selected from calcium Ca, Sr and Ba. Another example of an inorganic phosphor that may be used in embodiments of the invention, typically when the received light is blue light, is YAG:Ce. Furthermore, a part of the aluminum may be substituted with gadolinium (Gd) or gallium (Ga), wherein more Gd results in a red shift of the yellow emission. Other suitable materials may include $(Sr_{1-x-y}Ba_xCa_y)_{2-z}Si_{5-a}Al_aN_{8-a}O_a$:$Eu_z^{2+}$ wherein $0 \le a < 5$, $0 \le x \le 1$, $0 \le y \le 1$ and $0 < z \le 1$, and $(x+y) \le 1$, such as $Sr_2Si_5N_8$:$Eu^{2+}$ which emits light in the red range. Particles of inorganic phosphors may be dispersed in a matrix polymer, such as, for example, Polymethyl methacrylate (PMMA), Polyethylene terephthalate (PET), Polyethylene naphthalate (PEN) or polycarbonate (PC). In other embodiments, an inorganic phosphor may form the basis of a ceramic luminescent layer. It is to be noted that, in cases of the excitation of the luminescent material with UV light, the matrix polymer should be at least partially transparent to UV light. Polysiloxanes are UV transparent polymers.

Examples of organic luminescent materials suitable for use as the wavelength converting material include luminescent materials based on perylene derivatives, which are for instance sold under the brand name Lumogen by BASF. Examples of suitable commercially available products thus include, but are not limited to, Lumogen Red F305, Lumogen Orange F240, Lumogen Yellow F170, and combinations thereof. Molecules of an organic luminescent material may be dissolved in a matrix polymer, such as, for example, Polymethyl methacrylate (PMMA), Polyethylene terephthalate (PET), Polyethylene naphthalate (PEN) or polycarbonate (PC).

Examples of particles which show quantum confinement and have at least in one dimension a size in the nanometer range, are quantum dots, quantum rods and quantum tetrapods. Quantum confinement means that the particles have optical properties that depend on the size of the particles. The particles have at least in one dimension a size in the nanometer range. This means, for example, that, if the particles are substantially spherical, their diameter is in the nanometer range. Or, this means, for example, if they are wire-shaped, that a size of a cross-section of the wire is in one direction in the nanometer range. A size in the nanometer range means that their size in one dimension is at least smaller than 1 micrometer. Optionally their size in one dimension is smaller than 500 nanometer, and larger or equal to 0.5 nanometer. In an embodiment, their size in one dimension is smaller than 50 nanometer. In another embodiment their size in one dimension is in the range from 2 to 30 nanometer.

When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide (CuInS2) and/or silver indium sulfide (AgInS2) can also be used. Quantum dots show very narrow emission band and, thus, they show saturated colors. Furthermore the emission color can easily be tuned by adapting the size of the quantum dots. Any type of quantum dot known in the art may be used in the present invention, provided that it has the appropriate wavelength conversion characteristics.

Figure 1B:
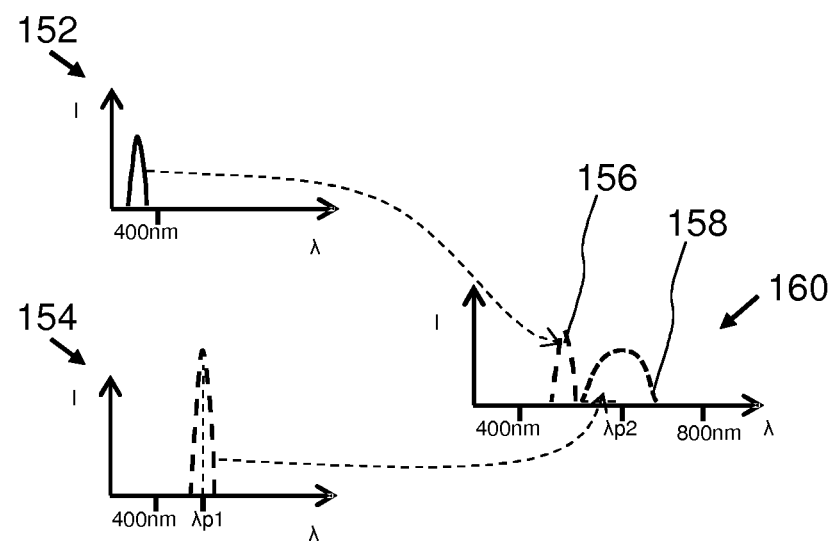

FIG. 1b schematically shows the conversion of spectra of light as it is performed by the light emitting device 100 of FIG. 1a. A first light emission spectrum 152 is emitted by the first light source 112. Substantially all wavelengths of the first light emission spectrum 152 have a wavelength below 400 nanometers. Thus, the first light emission spectrum 152 represents Ultra Violet light. A second light emission spectrum 154 is emitted by the second light source 118. The second light emission spectrum 154 has a first peak wavelength $\lambda_{p1}$ which is in the blue spectral range. The first luminescent material 106 converts most of the light of the first light emission spectrum 152 to a light emission peak 156 in the blue spectral range. The second luminescent material 116 almost fully converts all light of the second light emission spectrum 154 towards a third light emission spectrum 158 which has a second peak wavelength $\lambda_{p2}$. The second peak wavelength $\lambda_{p2}$ is larger than the first peak wavelength $\lambda_{p1}$ and, thus, has the third light emission spectrum 158 a color which may be green, yellow, orange, red, or a combination of these colors. In an optional embodiment, all light generated by the second luminescent material 116 is within in the spectral range which is visible to the human naked eye, and, thus, below 800 nanometers—but, when the second luminescent material 116 becomes hot, it may also irradiate electromagnetic waves in the infrared spectral range.

Figure 2A:
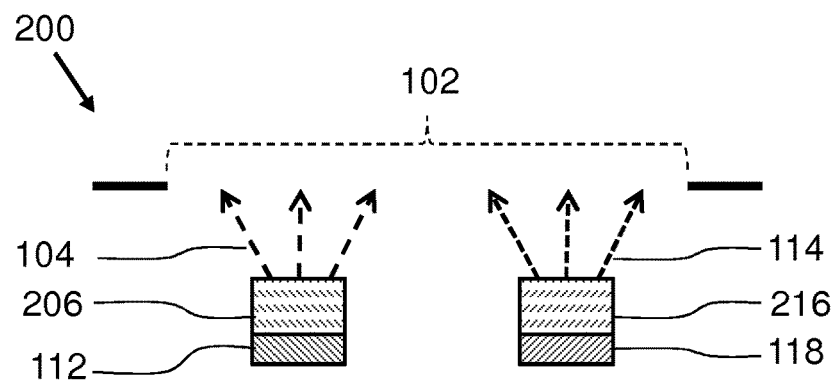

FIG. 2a schematically shows a cross-sectional view of a second embodiment of a light emitting assembly 200. The light emitting assembly 200 is similar to light emitting assembly 100 of FIG. 1a with a minor difference: the first luminescent material 206 is applied directly on top of a light emitting surface of the first light source 112 and the second luminescent material 216 is applied directly on top of a light emitting surface of the second light source 118. It may be, in certain applications, advantageous to apply the respective luminescent material 206, 216 directly on top of the respective light source 112, 118 because light emitted by the first light source 112 is only emitted towards the first luminescent material 206 and light of the second light source 118 is only emitted towards the second luminescent material 216. Further, a more compact light emitting assembly is obtainable.

Figure 2B:
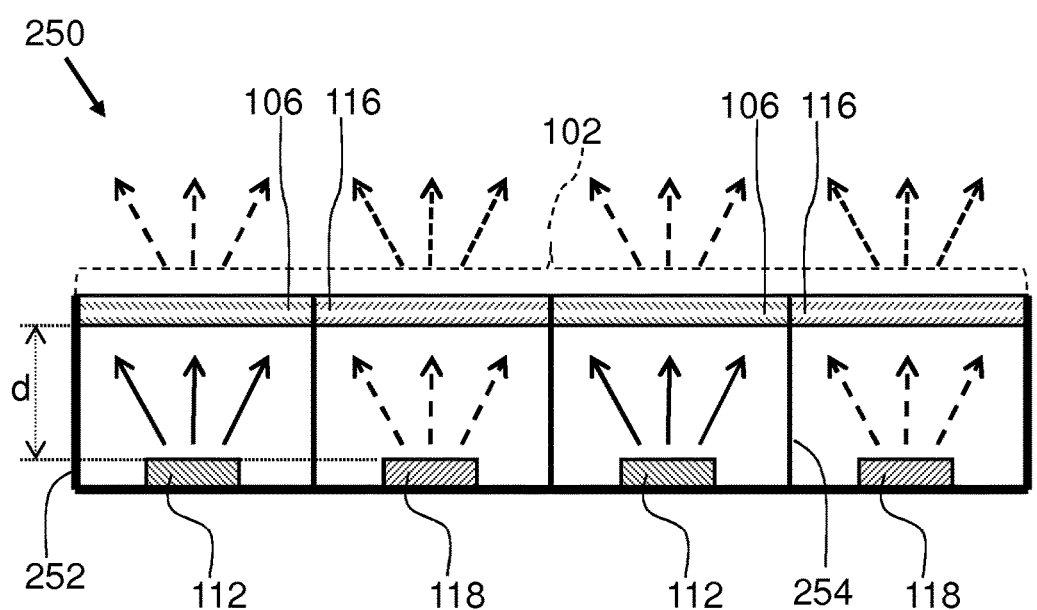

FIG. 2b schematically shows a cross-sectional view of a third embodiment of a light emitting assembly 250. The light emitting assembly 250 comprises a housing 252 which encloses a space with different chambers which are separated from each other by walls 254. The chambers extend in between a light exit window 102 and a base of the housing 252. In an embodiment, the walls do not transmit light and reflect light which impinges on them. The surfaces of the housing which face the chambers are also light reflective.

In each chamber one light source is provided and at the light exit window 102 the opening of the chamber is closed with a layer which comprises luminescent material. If a specific chamber comprises a first light source 112 which emits light in the Ultra Violet spectral range, the layer with luminescent material comprises the first luminescent material 106. If a specific chamber comprises a second light source 118 which emits light in the blue spectral range, the layer with luminescent material comprises the second luminescent material 116. In FIG. 2b, in between the respective light sources 112, 118 and the layers with the respective luminescent material, a gap is present of a distance d. The gap may be filled with air or another light transmitting gas, or the gap may be filled with a light transmitting (transparent or translucent) material, such as, for example, Silicone. If the gap is filled with a light transmitting material, the chambers may be fully filled with the light transmitting material or partially filled. The light transmitting material may act as a light guide for guiding the emitted light by the respective light source 112, 118 towards the layers with the respective luminescent material 106, 116. It is to be noted that embodiments of the light emitting assembly are not limited to light emitting assemblies with 4 chambers. The light emitting assembly may any number of chambers which are present, for example, in a lateral direction, or which are present, for example, in a direction perpendicular to the plane of the figure.

In the configuration of FIG. 2b, it is also possible to provide the respective luminescent materials at the walls of the respective chambers such that the layer with the respective luminescent materials are not arranged in a light-transmitting mode, but in a light-reflective mode. Light which impinges on the respective luminescent materials is absorbed and converted towards light of another color and the light of the another color is emitted backwards in the direction of the interior of the chamber. In such embodiments one has to provide absorbing filters at the light exit windows of the chambers such that no UV light and no light generated by the second light source is emitted into the ambient of the light emitting assembly.

Figure 3A:
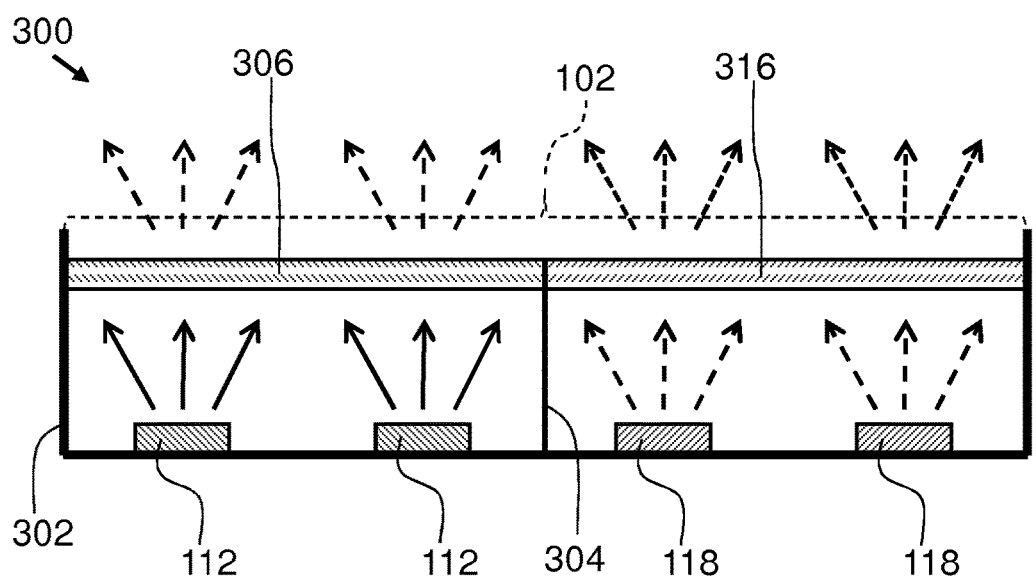

FIG. 3a schematically shows a cross-sectional view of a fourth embodiment of a light emitting assembly 300. The light emitting assembly is similar to the light emitting assembly 250 of FIG. 2b. Compared to the light emitting assembly 250, the light emitting assembly 300 has larger chambers which comprise more than one light source. In one chamber light source of the same type are provided and they are combined with their corresponding luminescent material in accordance with the first aspect of the invention. Thus, as shown in FIG. 3a, in the left drawn chamber a plurality of first light source 112 emit UV light towards a layer with a first luminescent material 306, and in the right drawn chamber a plurality of second light source 118 emit blue light towards a layer with the second luminescent material 316. The chambers are separated by walls 304.

Figure 3B:
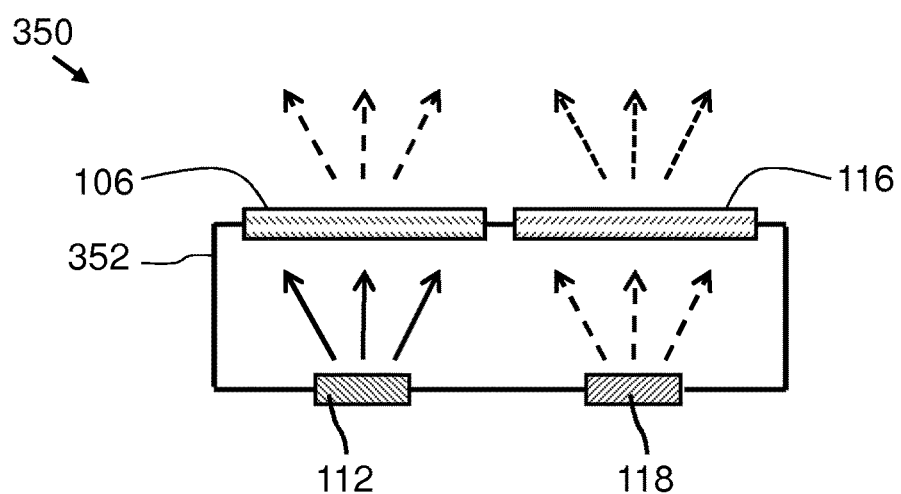

FIG. 3b schematically shows a cross-sectional view of a fifth embodiment of a light emitting assembly 350. The light emitting assembly 350 is similar to light emitting assembly 100 of FIG. 1a. In the light emitting assembly 350 a frame is provided which supports the first light source 112, the second light source 118, the layer with the first luminescent material 106 and the layer with the second luminescent material 116. The frame also arranges the respective light sources in such a position that the light emitted by the respective light sources 112, 118 is received by the corresponding luminescent material 106, 116. The frame may, for example, be manufactured from metal sheets, or metal bars.

Figure 4A:
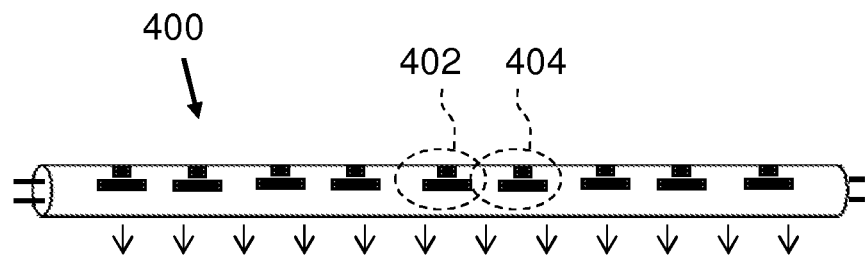

FIG. 4a schematically shows a first embodiment of a lamp in accordance with the second aspect of the invention. The lamp is a retrofit light-tube 400. The light-tube 400 comprises, in a lateral direction, a plurality combinations 402, 404 of light sources with its respective luminescent material. One combination may be a first light source 112 with the first luminescent material 106 of light emitting device 100 of FIG. 1a or the first light source 112 with the first luminescent material 206 of the light emitting device 200. Another used combination may be a second light source 118 with the second luminescent material 116 of light emitting device 100 of FIG. 1a or the second light source 118 with the second luminescent material 216 of the light emitting device 200. The glass of the light-tube 400 is the light exit window.

Figure 4B:
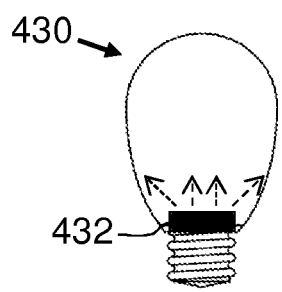

FIG. 4b schematically shows a second embodiment of a lamp which is a retrofit light bulb 430. The retrofit light bulb 430 comprises a base on which a light emitting assembly 432 in accordance with the first aspect of the invention is provided. The light emitting assembly 432 emits a combination of blue light, generated by the first luminescent material, and light of a higher wavelength, generated by the second luminescent material, towards the glass of the light bulb 430.

Figure 4C:
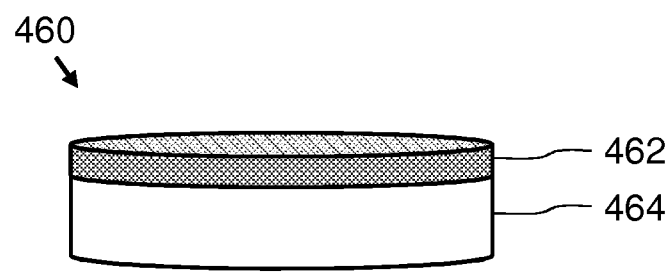

FIG. 4c schematically shows a third embodiment of a lamp which is a LED unit 460. The LED unit 460 comprise a housing 464 which has a cylindrical shape. The housing 464 encloses a cavity in which one or more light emitting assemblies according to the first aspect of the invention are provided. The light exit window is formed by a layer 462 which closes the cavity. The layer 462 may be a diffusing layer. Alternatively, the layer 462 may comprise spatially separated areas with, respectively, the first luminescent material and the second luminescent material, and the first light source(s) and the second light source(s) are provided inside the cavity.

Figure 5:
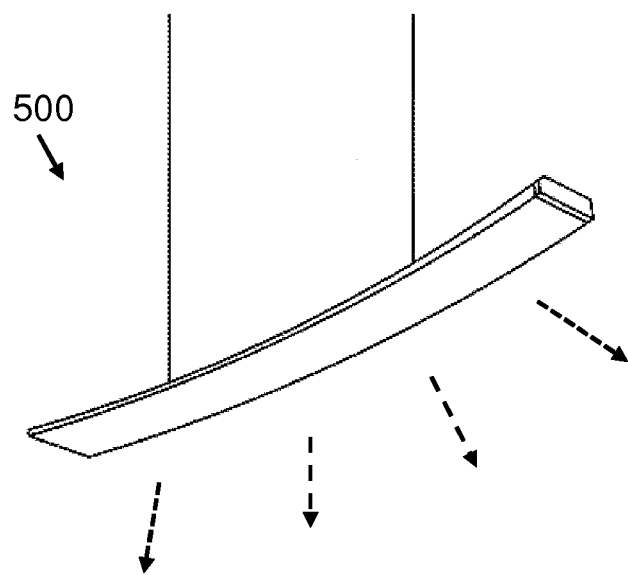

FIG. 5 schematically shows a luminaire 500 according to the third aspect of the invention. The luminaire comprises one or more light emitting assemblies according to the first aspect of the invention or comprises a lamp according to the second aspect of the inventions.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light emitting assembly, comprising:
    a first light source emitting light in a ultraviolet spectral range;
    a second light source emitting light in a blue spectral range having a first peak wavelength;
    a first luminescent material configured to receive and absorb the light in the ultraviolet spectral range from the first light source and to fully convert the absorbed light towards light having a peak in the blue spectral range;
    a second luminescent material configured to receive the light in the blue spectral range from the second light source and to convert the received light towards light of a spectral range having a second peak wavelength, the second peak wavelength being greater than the first peak wavelength; and
    a light exit window configured to transfer light emitted by the first luminescent material and by the second luminescent material into an ambient of the light emitting assembly.

2. The light emitting assembly according to claim 1, wherein the second luminescent material is configured to fully convert the received light in the blue spectral range towards light with the second peak wavelength.

3. The light emitting assembly according to claim 1, wherein the light of the spectral range with the second peak wavelength comprises light in at least one of the red, orange, and yellow spectral range.

4. The light emitting assembly according to claim 1, wherein the first luminescent material is in contact with the first light source and the second luminescent material is in contact with the second light source.

5. The light emitting assembly according to claim 1, wherein a gap is present between the first light source and the first luminescent material and a gap is present between the second light source and the second luminescent material.

6. The light emitting assembly according to claim 1, wherein the first light source, the first luminescent material, the second light source and the second luminescent material are configured to prevent cross-illumination between the first light source and the second luminescent material and between the second light source and the first luminescent material.

7. The light emitting assembly according to claim 1, comprising more than one first light source and comprising more than one second light source.

8. The light emitting assembly according to claim 1, wherein at least one of the first light source and the second light source is a solid state light emitter.

9. The light emitting assembly according to claim 1, wherein at least one of the first luminescent material and the second luminescent material comprises an inorganic phosphor, an organic phosphor, quantum dots, quantum rods, or quantum tetrapods.

10. The light emitting assembly according to claim 1, comprising:
    an ultraviolet filter configured to prevent the emission of light in the ultraviolet spectral range via the light exit window into the ambient.

11. The light emitting assembly according to claim 1 comprising a blue light absorption filter being arranged between the second luminescent material and the ambient to prevent leakage of light emitted by the second light source via the light exit window into the ambient.

12. A lamp comprising the light emitting assembly according to claim 1.

13. A luminaire comprising the light emitting assembly according to claim 1.

14. The light emitting assembly according to claim 6, further comprising one or more separation walls arranged to prevent the cross-illumination.

15. The light emitting assembly according to claim 6, further comprising a housing enclosing a space comprising different chambers separated from each other by walls for preventing the cross-illumination, each chamber comprising one light source and an opening at the light exit window, the opening being closed with a corresponding layer that comprises luminescent materials, chambers comprising the first light source having the corresponding layer of the specific chamber comprising the first luminescent material and chambers comprising the second light source having the corresponding layer of the specific other chamber comprising the second luminescent material.

* * * * *